US011355634B2

(12) United States Patent
Song et al.

(10) Patent No.: US 11,355,634 B2
(45) Date of Patent: Jun. 7, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Chun Song, Shanghai (CN); Mingjun Pei, Shanghai (CN)

(73) Assignees: Semiconductor Manufacturing International (Shanghai) Corporation, Shanghai (CN); Semiconductor Manufacturing: International (Beijing) Corporation, Beijing (CN)

( * ) Notice: Subject to any disclaimer, the term of this patent is extended or adjusted under 35 U.S.C. 154(b) by 6 days.

(21) Appl. No.: 16/748,381

(22) Filed: Jan. 21, 2020

(65) Prior Publication Data

US 2020/0251591 A1 Aug. 6, 2020

(30) Foreign Application Priority Data

Jan. 31, 2019 (CN) .......................... 201910097625.7

(51) Int. Cl.
*H01L 29/78* (2006.01)
*H01L 29/66* (2006.01)
(Continued)

(52) U.S. Cl.
CPC ........ *H01L 29/7831* (2013.01); *H01L 29/401* (2013.01); *H01L 29/41725* (2013.01);
(Continued)

(58) Field of Classification Search
CPC ............ H01L 29/401; H01L 29/66484; H01L 29/66545; H01L 29/66659; H01L 29/66681; H01L 29/66689; H01L 29/66704; H01L 29/7816; H01L 29/7825; H01L 29/7831
See application file for complete search history.

(56) References Cited

U.S. PATENT DOCUMENTS

| 4,929,988 A * | 5/1990 | Yoshikawa | ............ H01L 27/115 257/316 |
| 5,264,712 A * | 11/1993 | Murata | ................. H01L 27/105 257/300 |

(Continued)

*Primary Examiner* — Maliheh Malek
(74) *Attorney, Agent, or Firm* — Anova Law Group, PLLC (57) ABSTRACT

Semiconductor devices and fabrication methods are provided. An exemplary fabrication method includes providing a semiconductor substrate; forming a first well region and a second well region in the semiconductor substrate; and forming a first gate structure on a surface of the second well region and a portion of a surface of the first well region and a second gate structure on a portion of the first well region. A first opening is formed between the first gate structure and the second gate structure. The method also include forming a sidewall spacer layer covering sidewall and bottom surfaces of the first opening in the first opening; forming a dielectric layer on the semiconductor substrate to cover the first gate structure, the second gate structure and the sidewall spacer layer; and forming a floating plug in the dielectric layer and on the sidewall spacer layer.

19 Claims, 4 Drawing Sheets

(51) Int. Cl.
*H01L 29/40* (2006.01)
*H01L 29/417* (2006.01)

(52) U.S. Cl.
CPC .. *H01L 29/66484* (2013.01); *H01L 29/66689* (2013.01); *H01L 29/7816* (2013.01)

(56) References Cited

U.S. PATENT DOCUMENTS

| | | | | |
|---|---|---|---|---|
| 5,276,344 A * | 1/1994 | Arima | ............... | H01L 27/1085 257/306 |
| 6,046,474 A * | 4/2000 | Oh | ............... | H01L 21/823462 257/343 |
| 6,190,968 B1 * | 2/2001 | Kalnitsky | ......... | H01L 27/11521 257/E21.682 |
| 6,395,569 B1 * | 5/2002 | Laureanti | ............... | H01L 22/14 257/E21.531 |
| 6,770,934 B1 * | 8/2004 | Hung | ............... | H01L 27/115 257/331 |
| 6,888,193 B2 * | 5/2005 | Huang | ............... | H01L 27/115 257/316 |
| 6,953,963 B2 * | 10/2005 | Wang | ............... | H01L 27/115 257/314 |
| 8,304,831 B2 * | 11/2012 | Zhu | ............... | H01L 29/7835 257/343 |
| 8,409,956 B1 * | 4/2013 | Kang | ............... | H01L 21/76897 438/279 |
| 8,563,377 B2 * | 10/2013 | Yedinak | ............... | H01L 29/7813 438/259 |
| 9,490,360 B2 * | 11/2016 | Chen | ............... | H01L 21/761 |
| 9,508,605 B2 * | 11/2016 | Tsai | ............... | H01L 27/092 |
| 9,711,593 B2 * | 7/2017 | Tseng | ............... | H01L 29/66659 |
| 9,997,418 B2 * | 6/2018 | Pranatharthiharan | ............... | H01L 23/5226 |
| 10,026,819 B2 * | 7/2018 | Kim | ............... | H01L 29/4991 |
| 10,395,931 B2 * | 8/2019 | Li | ............... | H01L 29/66545 |
| 10,411,061 B2 * | 9/2019 | Qi | ............... | H01L 27/14636 |
| 10,446,671 B2 * | 10/2019 | Okamoto | ............... | H01L 29/1255 |
| 2003/0227037 A1 * | 12/2003 | Moscatelli | ...... | H01L 21/823814 257/288 |
| 2004/0159886 A1 * | 8/2004 | Lee | ............... | H01L 27/11526 257/331 |
| 2005/0176201 A1 * | 8/2005 | Liu | ............... | H01L 27/115 438/257 |
| 2006/0035437 A1 * | 2/2006 | Mitsuhira | ............... | H01L 27/105 438/424 |
| 2007/0152265 A1 * | 7/2007 | Moriyama | ............... | H01L 27/115 257/324 |
| 2007/0228444 A1 * | 10/2007 | Nakata | ............... | H01L 29/7885 257/314 |
| 2008/0061354 A1 * | 3/2008 | Chih | ............... | H01L 27/11526 257/316 |
| 2008/0308874 A1 * | 12/2008 | Letavic | ............... | H01L 29/0878 257/369 |
| 2010/0006934 A1 * | 1/2010 | Su | ............... | H01L 29/7816 257/341 |
| 2010/0200909 A1 * | 8/2010 | Kawashima | ............... | H01L 29/792 257/326 |
| 2011/0156142 A1 * | 6/2011 | Teo | ............... | H01L 29/7835 257/336 |
| 2011/0193161 A1 * | 8/2011 | Zhu | ............... | H01L 29/66545 257/343 |
| 2012/0098063 A1 * | 4/2012 | Tsai | ............... | H01L 29/4933 257/339 |
| 2013/0256788 A1 * | 10/2013 | Kosuge | ............... | H01L 29/7827 257/330 |
| 2013/0292763 A1 * | 11/2013 | Chang | ............... | H01L 29/7835 257/335 |
| 2014/0231908 A1 * | 8/2014 | Chen | ............... | H01L 29/66681 257/336 |
| 2014/0239391 A1 * | 8/2014 | Toh | ............... | H01L 29/66681 257/339 |
| 2014/0264538 A1 * | 9/2014 | Yu | ............... | H01L 21/823456 257/316 |
| 2014/0342541 A1 * | 11/2014 | Liou | ............... | H01L 29/51 438/591 |
| 2015/0145034 A1 * | 5/2015 | Lee | ............... | H01L 29/0878 257/336 |
| 2015/0187933 A1 * | 7/2015 | Lin | ............... | H01L 29/0878 257/339 |
| 2015/0206968 A1 * | 7/2015 | Cascino | ............... | H01L 29/0882 257/339 |
| 2015/0364326 A1 * | 12/2015 | Xie | ............... | H01L 29/78 257/288 |
| 2016/0141413 A1 * | 5/2016 | Noh | ............... | H01L 29/4238 257/337 |
| 2016/0181400 A1 * | 6/2016 | Qian | ............... | H01L 29/66659 257/343 |
| 2016/0315189 A1 * | 10/2016 | Song | ............... | H01L 29/404 |
| 2017/0178975 A1 * | 6/2017 | Chang | ............... | H01L 23/485 |
| 2017/0229570 A1 * | 8/2017 | Cheng | ............... | H01L 29/785 |
| 2017/0263717 A1 * | 9/2017 | Lin | ............... | H01L 29/1095 |
| 2018/0005886 A1 * | 1/2018 | Zhang | ............... | H01L 21/31116 |
| 2018/0108755 A1 * | 4/2018 | Liu | ............... | H01L 29/7835 |
| 2018/0151560 A1 * | 5/2018 | Hsu | ............... | H01L 21/76897 |
| 2018/0197987 A1 * | 7/2018 | Zhou | ............... | H01L 29/66545 |
| 2018/0269252 A1 * | 9/2018 | Qi | ............... | H01L 27/14636 |
| 2018/0277677 A1 * | 9/2018 | Lin | ............... | H01L 29/401 |
| 2019/0097044 A1 * | 3/2019 | Lee | ............... | H01L 21/76 |
| 2020/0135918 A1 * | 4/2020 | Zhou | ............... | H01L 21/32136 |
| 2020/0295000 A1 * | 9/2020 | Lin | ............... | H01L 21/823468 |
| 2021/0074855 A1 * | 3/2021 | Chen | ............... | H01L 29/1083 |
| 2021/0082770 A1 * | 3/2021 | Xie | ............... | H01L 21/823431 |
| 2021/0184034 A1 * | 6/2021 | Mehrotra | ............... | H01L 29/0653 |

\* cited by examiner

SEMICONDUCTOR DEVICE AND FABRICATION METHOD THEREOF

CROSS-REFERENCES TO RELATED APPLICATIONS

This application claims the priority of Chinese patent application No. 201910097625.7, filed on Jan. 31, 2019, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

Power semiconductor devices are widely used in switching power supplies, automotive electronics, industrial controls, wireless communications, motor controls and many other fields. Two essential indicators of the power semiconductor devices are high breakdown voltage and low on-resistance. Lateral diffused metal oxide semiconductor (LDMOS) device is a power MOS device; and mainly used in power integrated circuits.

The structure of an asymmetric LDMOS device often includes a first well region and a second well region formed in a semiconductor substrate. The conductivity type of the ions of the first well region and the conductivity type of the ions of the second well region are different. The asymmetric LDMOS device also includes a gate structure formed on the first well region and the second well region; and a doped source layer and a doped drain layer respectively formed in the substrate at both sides of the gate structure. The doped drain layer is formed in the first well region, and the source doped layer is formed in the second well region. The doped source layer and the doped drain layer are doped with source/drain ions. The conductivity type of the source/drain ions is the same as the conductivity type of the first well region. The portion of the second well region covered by the gate structure is a channel region of the LDMOS device. The first well region between the doped drain layer and the channel region is a drift region of the LDMOS device. The drift region is used to change the electric field distribution of the LDMOS device and increase the breakdown voltage of the LDMOS device. However, if the device structure is further shrunk, the effect for improving the breakdown voltage is not significant.

Thus, as the size of semiconductor device is continuously shrunk, a transistor structure of a lateral diffusion enhanced metal oxide semiconductor (LDEMOS) has been developed. A floating plug is formed in a dielectric layer on the gate structure and the doped drain layer of the LDEMOS. The floating plug is connected to a voltage to form a depletion layer in the semiconductor substrate under the floating plug to increase the breakdown voltage of the LDEMOS.

However, there is a need to further improve the performance of the LDEMOS device. The disclosed methods and semiconductor devices are directed to solve one or more problems set forth above and other problems in the art.

BRIEF SUMMARY OF THE DISCLOSURE

One aspect of the present disclosure includes a method for forming a semiconductor device. The method may include providing a semiconductor substrate; and forming a first well region and a second well region in the semiconductor substrate. The second well region may be formed in the first well region and a conductivity type of the first well region may be opposite to a conductivity type of the second well region. The method may also include forming a first gate structure on a surface of the second well region and a portion of a surface of the first well region and a second gate structure on a portion of the first well region. A first opening may be formed between the first gate structure and the second gate structure. Further, the method may include forming a sidewall spacer layer to cover sidewall and bottom surfaces of the first opening; forming a dielectric layer on the semiconductor substrate to cover the first gate structure, the second gate structure and the sidewall spacer layer; and forming a floating plug in the dielectric layer and on the sidewall spacer layer.

Another aspect of the present disclosure includes a semiconductor device. The semiconductor structure may include a semiconductor substrate; and a first well region and a second well region in the semiconductor substrate. The second well region may be in the first well region and a conductivity type of the first well region may be opposite to a conductivity of the second well region. The semiconductor device may also a first gate structure and a second gate structure on the semiconductor substrate. The first gate structure may coves a portion of a surface of the first well region and a portion of a surface of the second well region; and a first opening may be formed between the first gate structure and the second gate structure. Further, the semiconductor device may include a sidewall spacer layer in the first opening; a dielectric layer on the semiconductor substrate and covering the first gate structure, the second gate structure and the sidewall spacer layer; and a floating plug in the dielectric layer and on the sidewall spacer layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
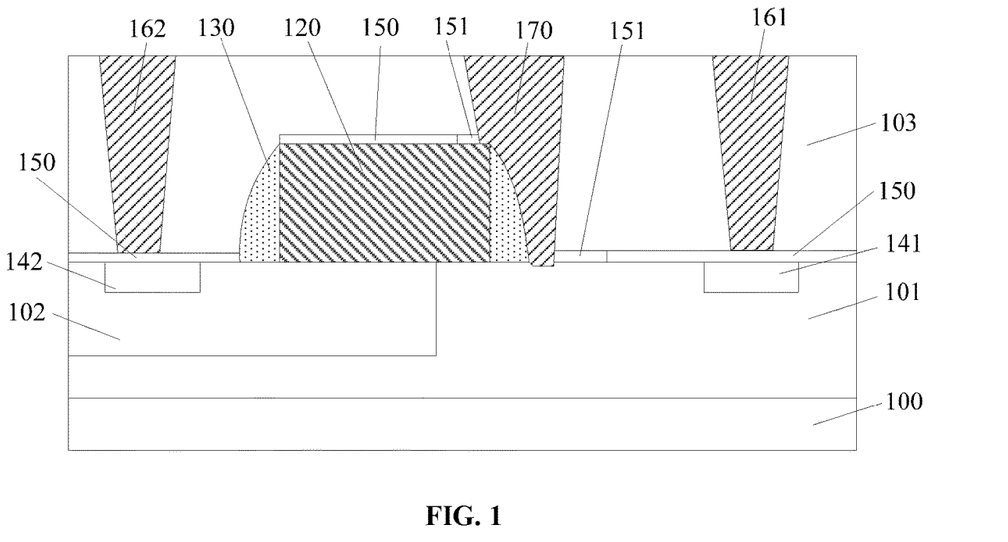
FIG. 1 illustrates a semiconductor device.

FIG. 1 illustrates a semiconductor device. As shown in FIG. 1, the semiconductor device includes a semiconductor substrate 100 and a first well region 101 and a second well region 102 formed in the semiconductor substrate 100. The second well region 102 is formed in the first well region 101. The conductivity type of the first well region 101 is opposite to the conductivity type of the second well region 102.

Further, the semiconductor device includes a gate structure 120 formed on the semiconductor substrate 100. The gate structure 120 is located on the first well region 101 and the second well region 102. Further, the semiconductor device includes sidewall spacers 130 on the sidewall surfaces of the gate structure 120; and a doped source layer 142 and a doped drain layer 141 formed in the semiconductor substrate 100 at both sides of the gate structure 120 and the sidewall spacers 130. The doped source layer 142 is located in the second well region 102, and the doped drain layer 141 is located in the first well region 101. The conductivity type of the doped source layer 142 and the doped drain layer 141 is opposite to the conductivity type of the second well region 102. Further, the semiconductor device includes a metal silicide layer 150 on the surface of the portion of the semiconductor substrate 100 and the surface of the doped drain layer 141 and the surface of the doped source layer 142; and a protective layer 151 on the surface of the portion of the gate structure 120 adjacent to the doped drain layer 141 and the surface of the semiconductor substrate 100 between the portion of the gate structure 120 and the doped drain layer 141. Further, the semiconductor device includes a dielectric layer 103 on the semiconductor substrate 100. The dielectric layer 103 covers the gate structure 120 and the sidewall spacers 130. Further, the semiconductor device includes a source plug 161, a drain plug 162, and a floating plug 170 in the dielectric layer 103. The source plug 161 is electrically connected to the metal silicide layer 150 on the surface of the doped source layer 142. The drain plug 162 is electrically connected to the metal silicide layer 150 on the surface of the doped drain layer 141. The floating plug 170 is formed on the sidewall spacers 130 between the gate structure 120 and the doped drain layer 141.

When a voltage is applied to the floating plug 170, a depletion region, i.e., a high resistance region, is formed in the well region under the floating plug 170. The second well region 102 covered by the gate structure 120 is a channel region of the semiconductor device. When a voltage is applied to the drain plug 162, the movement trajectory of the carriers is from the doped drain layer 141 to the first well region 101. In the first well region 101, the carriers need to move round the space charge region to reach the channel region, thereby reaching the doped source layer 142. Accordingly, the breakdown voltage of the semiconductor device is increased.

The floating plug 170 is formed by forming a floating plug opening in the dielectric layer 103, and forming the floating plug 170 in the floating plug opening. The source plug 161 and the drain plug 162 are formed by forming a source plug opening and a drain plug opening in the dielectric layer 103, and forming the source plug 161 in the source plug opening and the drain plug 162 in the drain plug opening, respectively.

To simplify the fabrication process, the floating plug opening is formed during forming the source plug opening and the drain plug opening. However, the source plug opening and the drain plug opening have the metal silicide layer 150 at the bottoms, during the process for forming the source plug opening and the drain plug opening, even if an over-etching occurs, the doped source layer 142 and the doped drain layer 141 may not be damaged. However, the over-etching causes the floating plug opening to be too deep and the surface of the first well region 101 of the semiconductor substrate 100 may be exposed. Accordingly, the subsequently formed floating plug 170 is connected to the first well region 101; and the performance of the semiconductor device is not as desired.

Further, the floating plug 170 is located on the sidewall spacer 130 adjacent to the doped drain layer 141. A photoresist pattern layer is used as a mask when forming the floating plug opening. To ensure the size of the formed floating plug opening, the size of the opening in the photoresist pattern layer is often larger than the actual size of the floating plug opening. During the over-etching process, the size of the floating plug opening is also increased, which may cause the floating plug opening to expose a portion of the gate structure 120. Accordingly, the floating plug 170 and the gate structure 120 may be short-circuited; and the performance of the semiconductor device is adversely affected.

To ensure that the floating plug 170 does not contact with the semiconductor substrate and the gate structure, it is necessary to precisely control the distance between the floating plug and the metal silicide layer on the gate structure and the distance between the floating plug and the metal silicide layer on the first well region, as well as the formation process of the floating plug opening. Thus, the production efficiency is low; and the yield is low. Further, the performance of the semiconductor device may not be as desired.

The present disclosure provides a semiconductor device and a method for forming a semiconductor device. In the method for forming the semiconductor device, a first gate structure and a second gate structure may be formed on the semiconductor substrate. A first opening may be formed between the second gate structure and the first gate structure; and a sidewall spacer layer may be formed in the first opening. The floating plug may be formed on on the second gate structure and the sidewall spacer layer. Such a structure may reduce the probability of the floating plug being shorted to the semiconductor substrate and the gate structure; and the performance of the semiconductor device may be improved.

Figure 6:
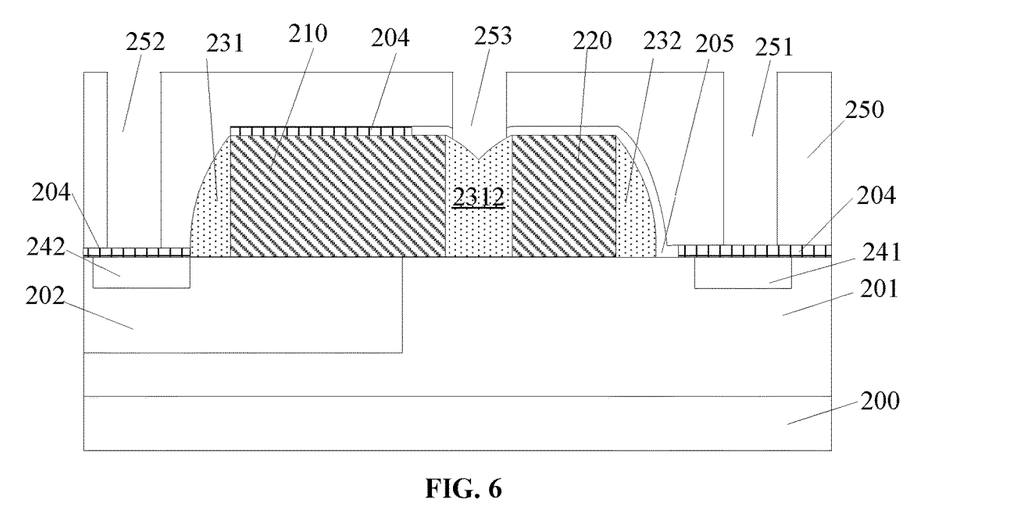
Figure 7:
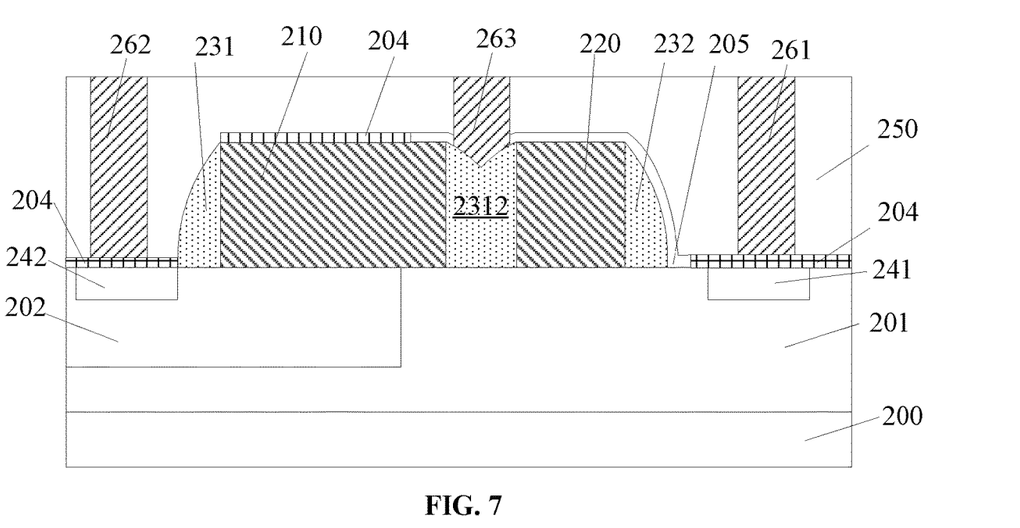
Figure 8:
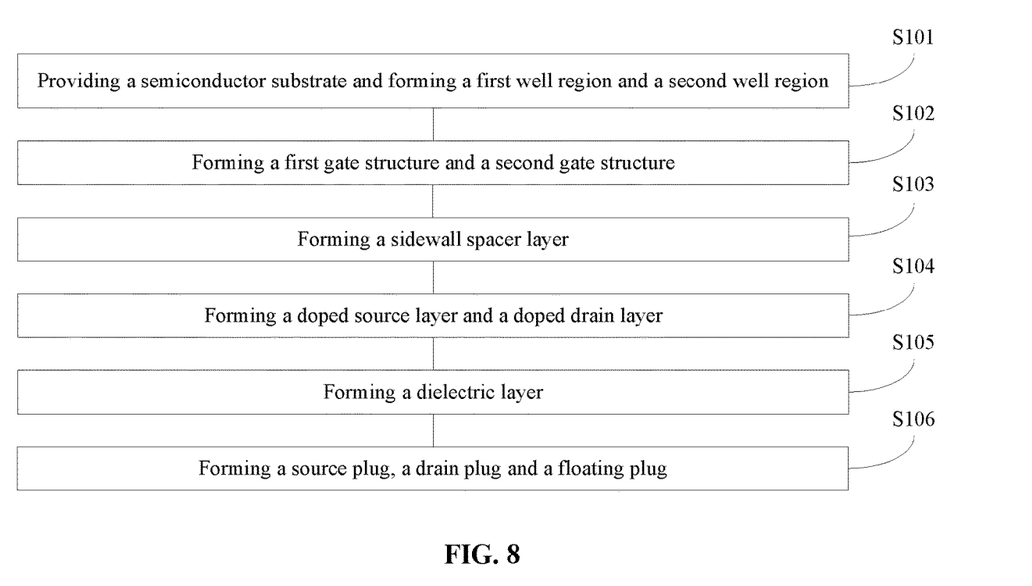
FIG. 8 illustrates an exemplary fabrication process of a semiconductor device consistent with various disclosed embodiments of the present disclosure.

FIG. 8 illustrates an exemplary fabrication process of a semiconductor device consistent with various disclosed embodiments of the present disclosure. FIGS. 2-7 illustrate semiconductor structures corresponding certain stages during the exemplary fabrication process of the semiconductor device.

Figure 2:
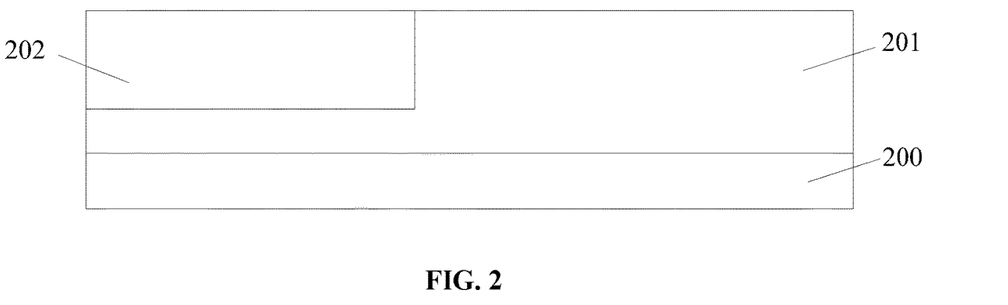
FIGS. 2-7 illustrate structures corresponding to certain stages during an exemplary fabrication process of a semiconductor device consistent with various disclosed embodiments of the present disclosure.

As shown in FIG. 8, at the beginning of the fabrication process, a semiconductor substrate with certain structures is provided (S101). FIG. 2 illustrates a corresponding semiconductor structure.

As shown in FIG. 2, a semiconductor substrate 200 is provided. In one embodiment, the semiconductor substrate 200 is a planar semiconductor substrate. In some embodiments, the semiconductor substrate may be a base semiconductor substrate and a plurality of fins formed on the base semiconductor substrate.

In one embodiment, the semiconductor substrate 200 is made of single crystal silicon. The semiconductor substrate 200 may also be made of polysilicon or amorphous silicon. In some embodiments, the semiconductor substrate 200 may be made of other appropriate semiconductor material, such as germanium, silicon germanium, or gallium arsenide, etc.

Further, a first well region 201 and a second well region 202 may be formed in the semiconductor substrate 200. The second well region 202 may be formed in the first well region 201. The conductivity type of the first well region 201 may be opposite to the conductivity type of the second well region 202.

The first well region 201 may have a first type of ions; and the second well region 202 may have a second type of ions. The conductivity type of the first type of ions may be opposite to the conductivity type of the second type of ions.

When the semiconductor device is a P-type device, the conductivity type of the first type of ions may be N-type. The first type of ions may include phosphorus ions, arsenic ions, or antimony ions. The conductivity type of the second type of ions may be P-type. The second type of ions may include boron ions, $Br^{2-}$ ions, or indium ions, etc.

When the semiconductor device is an N-type device, the conductivity type of the first type of ions may be P-type. The first type of ions may include boron ions, $Br^{2-}$ ions, or indium ions, etc. The conductivity type of the second type of ions may be N-type. The second type of ions may include phosphorus ions, arsenic ions, or antimony ions, etc.

The method for forming the first well region 201 and the second well region 202 may include forming a first pattern layer on the semiconductor substrate 200. The first pattern layer may expose a portion of the surface of the semiconductor substrate 200. Then, a first ion implantation process may be performed on the semiconductor substrate 200 using the first pattern layer as a mask to form the first well region 201 in the semiconductor substrate 200. The ions of the first ion implantation process may be the first type of ions. Then, the first pattern layer may be removed and a second pattern layer may be formed on the semiconductor substrate 200. The second pattern layer may expose a portion of the surface of the first well region 201. Then, a second ion implantation may be performed on the portion of the surface of the first well region 201 exposed by the second pattern layer using the second pattern layer as a mask to form the second well region 202 in the first well region 201. The ions of the second ion implantation process may be the second type of ions.

In one embodiment, the semiconductor device is an N-type device, the first type of ions may be boron ions; and the second type of ions may be phosphorus ions.

Figure 3:
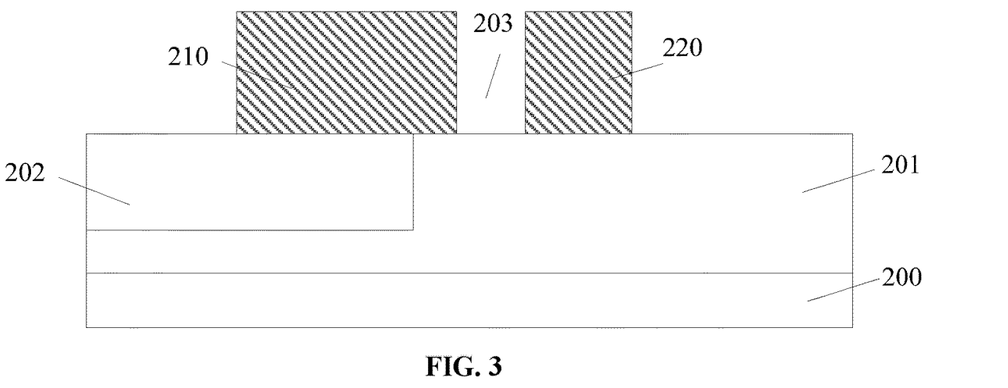

Returning to FIG. 8, after providing the semiconductor substrate and forming the first well region and the second well region, a first gate structure and a second gate structure may be formed (S102). FIG. 3 illustrates a corresponding semiconductor structure.

As shown in FIG. 3, a first gate structure 210 and a second gate structure 220 may be formed on the semiconductor substrate 200. The first gate structure 210 may cover a portion of the surface of the second well region 202 and a portion of the surface of the first well region 201. The second gate structure 220 may be formed on the surface of the first well region 201. A first opening 203 may be formed between the first gate structure 210 and the second gate structure 220. In particular, the space between the first gate structure 210 and the second gate structure 220 may be referred to as the first opening 203.

The first opening 203 may provide a space for subsequently forming a sidewall spacer layer.

The distance between the second gate structure 220 and the first gate structure 210 (e.g., a distance between two adjacent sidewall surfaces of the second gate structure 220 and the first gate structure 210) may be in a range of approximately 150 nm to 300 nm. The distance between the second gate structure 220 and the first gate structure 210 may determine the size of the first opening 203 such that the subsequently formed first sidewall spacer and the subsequently formed second sidewall spacer may cover the sidewall surfaces and the bottom of the first opening 203. If the size of the first opening is too large, after forming the first sidewall spacer and the second sidewall spacer in the first opening, the bottom surface of the first opening may not be covered, and the subsequently formed floating plug may have a higher probability of contacting with the semiconductor substrate. If the size of the first opening is too small, it may not facilitate to deposit the first sidewall spacer and the second sidewall spacer, and the process difficulty for forming the first sidewall spacer and the second sidewall spacer may be increased.

The first gate structure 210 may include a first gate dielectric layer and a first gate electrode layer on the first gate dielectric layer. The first gate dielectric layer may cover a portion of the surface of the second well region 202 and a portion of the surface of the first well region 201.

The first gate dielectric layer and the first gate electrode layer may be made of any appropriate material. In one embodiment, the first gate dielectric layer of the first gate structure 210 is made of silicon oxide, and the first gate electrode layer of the first gate structure 210 is made of polysilicon.

The second gate structure 220 may include a second gate dielectric layer and a second gate electrode layer on the second gate dielectric layer. The second gate dielectric layer may cover a portion of the surface of the first well region 201.

The second gate dielectric layer and the second gate electrode layer may be made of any appropriate material. In one embodiment, the second gate dielectric layer is made silicon oxide; and the second gate electrode layer is made of polysilicon.

In one embodiment, the second gate structure 220 is formed during the process for forming the first gate structure 210.

The method for forming the first gate structure 210 and the second gate structure 220 may include forming an initial gate structure film (not shown) on the semiconductor substrate 200. The initial gate structure film may cover the surface of the first well region 201 and the surface of the second well region 202. Then, a second mask layer (not shown) may be formed on the surface of the initial gate structure film. The second mask layer may cover a portion of the initial gate structure film. Then, the initial gate structure film may be etched using the second mask layer as a mask to form the first gate structure 210 and the second gate structure 220.

The initial gate structure film may include an initial gate dielectric film and an initial gate electrode film on a surface of the initial gate dielectric film.

In some embodiments, the second gate structure may be formed after forming the first gate structure. In other embodiments, the first gate structure may be formed after forming the second gate structure. In one embodiment, the second gate structure is formed during forming the first gate structure.

Figure 4:
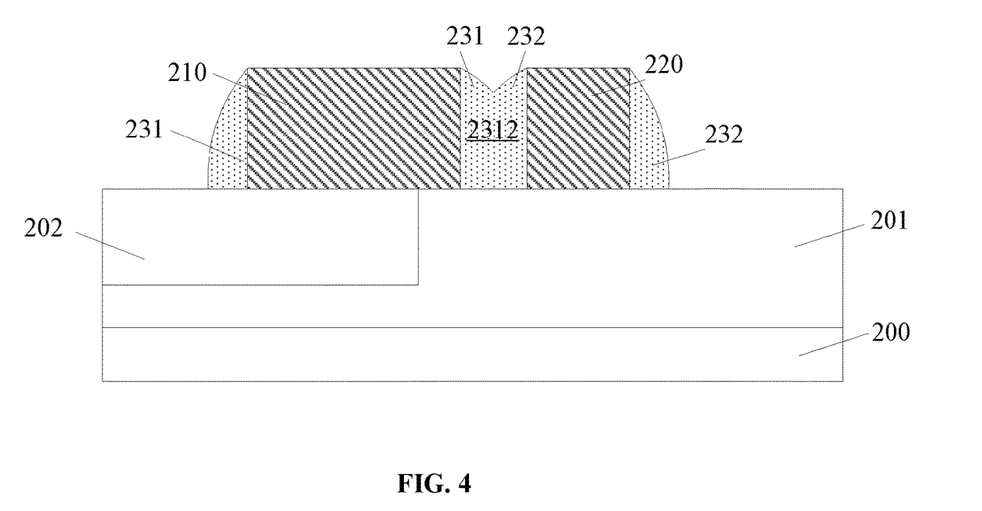

Returning to FIG. 8, after forming the first gate structure and the second gate structure, a sidewall spacer layer may be formed (S103). FIG. 4 illustrates a corresponding semiconductor structure.

As shown in FIG. 4, a sidewall spacer layer 2312 may be formed in the first opening 203. The sidewall spacer layer 2312 may cover the sidewall surfaces and the bottom of the first opening 203.

In one embodiment, first sidewall spacers 232 may be formed on sidewall surfaces of the second gate structure 220; and second sidewall spacers 231 may be formed on the sidewall surfaces of the first gate structure 210. The sidewall spacer layer 2312 may include one first sidewall spacer 232 and one second sidewall spacer 231 in the first opening 203, as shown in FIG. 4.

The one first sidewall spacer 232 and the one second sidewall spacer 231 in the first opening 203 may cover the sidewall surfaces and the bottom of the first opening 203.

The first sidewall spacers 232 and the second sidewall spacers 231 may have a same thickness. The thickness of each of the first sidewall spacers 232 may be less than or equal to approximately of 1500 angstroms.

A distance between the first gate structure and the second gate structure is approximately equal to or smaller than a sum of a thickness of the first sidewall spacer and a thickness of the second sidewall spacer. A sum of the thickness of the first sidewall spacer 232 in the first opening 203 and the thickness of the second sidewall spacer 231 in the first opening 203 may be equal to the distance between the first gate structure 210 and the second gate structure 220. A sum of the thickness of the first sidewall spacer 232 not in the first opening 203 and the thickness of the second sidewall spacer 231 not in the first opening 203 may be greater than or equal to the distance between the first gate structure 210 and the second gate structure 220.

The second sidewall spacers 231 may be formed during forming the first sidewall spacers 232.

The method for forming the first sidewall spacers 232 and the second sidewall spacers 231 may include forming a sidewall spacer material layer (not shown) on the semiconductor substrate 200 by covering the first gate structure 210 and the second gate structure 220; etching back the sidewall spacer material layer to form the second spacers 231 on the sidewall surfaces of the first gate structure 210 and to form the first sidewall spacers 232 on the sidewall surfaces of the second gate structure 220. The sidewall spacer layer 2312 may be simultaneously formed in the first opening 203 by the one first sidewall spacer 232 and the one second sidewall spacer 231 in the first opening 203.

The process for forming the sidewall spacer material layer may include one or more of a chemical vapor deposition (CVD) process, a physical vapor deposition (PVD) process, and an atomic layer deposition (ALD) process, etc.

The first sidewall spacers 232 and the second sidewall spacers 231 may be made of any appropriate material, such as silicon oxide, silicon nitride, silicon oxynitride, silicon oxycarbide, silicon carbonitride, or silicon oxycarbonitride, etc. In one embodiment, the first sidewall spacers 232 and the second sidewall spacers 231 are made of silicon nitride.

The first sidewall spacers 232 and the second sidewall spacers 231 may be made of silicon nitride, and a subsequently formed dielectric layer may be made of silicon oxide. In the subsequent process for forming a floating plug opening by etching the dielectric layer, an etching gas with a substantially large etching selectivity to silicon oxide and silicon nitride may be selected. On the basis of removing the dielectric layer, the etching to the first sidewall spacers and the second sidewall spacers in the first opening may be reduced, and the probability that the floating plug is connected to the semiconductor substrate may be reduced.

Figure 5:
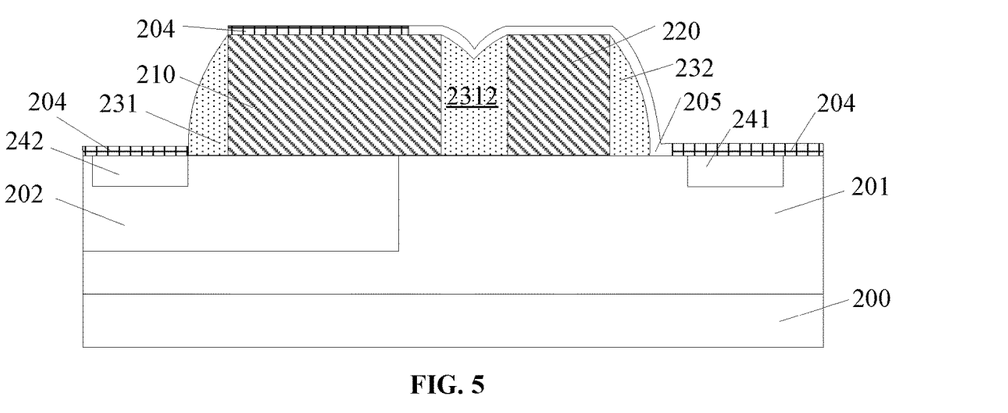

Returning to FIG. 8, after forming the sidewall spacer layer, a doped source layer and a doped drain layer may be formed (S104). FIG. 5 illustrates a corresponding semiconductor structure.

As shown in FIG. 5, a doped source layer 242 and a doped drain layer 241 may be formed in the semiconductor substrate 200 at both sides of the first gate structure 210, the second gate structure 220, the first sidewall spacers 232, and the second sidewall spacers 231. The doped source layer 242 may be formed in the second well region 202. The doped drain layer 241 may be formed in the first well region 201. The conductivity type of the doped source layer 242 and the doped drain layer 241 may be the same as the conductivity type of the first well region 201.

The method for forming the doped source layer 242 and the doped drain layer 241 may include forming a source trench and a drain trench in the semiconductor substrate 200 at both sides of the first gate structure 210, the second gate structure 220, the first sidewall spacers 232, and the second spacers 231, respectively; and forming the doped source layer 242 and the doped drain layer 241 in the source trench and the drain trench, respectively, by an epitaxial growth process.

The doped source layer 242 and the doped drain layer 241 may be doped with source/drain ions. The source/drain ions may have the same conductivity type as the first type of ions.

When the first gate structure 210 is used to form a P-type device, the material of the doped source layer 242 and the doped drain layer 241 may include silicon, germanium or silicon germanium, etc. The source/drain ions may be P-type ions; and may include boron ions, $BF^{2-}$ ions, or indium ions, etc.

When the first gate structure 210 is used to form an N-type device, the material of the doped source layer 242 and the doped drain layer 241 may include silicon, gallium arsenide, or indium gallium arsenide, etc. The source/drain ions may be N-type ions; and may include phosphorus ions, arsenic ions or antimony ions.

When forming the doped source layer 242 and the doped drain layer 241 in the source trench and drain trench respectively, an in situ doping process may be performed to dope the source/drain ions in the doped source layer 242 and the doped drain layer 241.

When a drain terminal voltage is applied to the doped drain layer 241, the carrier type generated by the drain terminal voltage may be opposite to the carrier type in the first well region 201 such that a neutralization reaction may occur. Accordingly, the number of the drain carriers reaching the gate structure may be reduced; and a voltage division may be achieved. In the case where the voltage applied to the gate structure is constant, the drain terminal may be able to withstand a higher voltage. Thus, the voltage that the semiconductor device can withstand may be increased; and the performance of the semiconductor device may be increased.

After forming the doped source layer 242 and the doped drain layer 241, a protective layer 205 may be formed on a portion of the first gate structure 210 adjacent to the second gate structure 220, the sidewall spacers, the second gate structure 220, and a portion of the surface of the semiconductor substrate 200 between the second gate structure 220 and the doped drain layer 241. The distance between the protective layer 205 and the doped drain layer 241 may be greater than or equal to zero.

Further, after forming the protective layer 205, a metal silicide layer 204 may be formed on the surface of the semiconductor substrate 200 exposed by the protective layer 205, the surface of the first gate structure exposed by the protective layer 205, the surface of the doped source layer 242, and the surface of the doped drain layer 241. The protective layer 205 may protect formed structures when forming the metal silicide layer 204.

The protective layer 205 may be made of any appropriate material, such as silicon oxide, etc. The metal silicide layer 204 may be made of any appropriate material, such as NiSi, CoSi, or TiSi, etc. In one embodiment, the metal silicide layer 204 is made of CoSi.

The method for forming the metal silicide layer 204 may include forming a metal layer on the semiconductor substrate 200. The metal layer may cover the first gate structure 220, the second sidewall spacers 231 and the protective layer 205. Then, an annealing process may be performed on the metal layer, the semiconductor substrate 200 and the first gate structure 200; and the metal silicide layer 204 may be formed on the surface of the semiconductor substrate 200 exposed by the protective layer 205, the surface of the first gate structure 210 exposed by the protective layer, the surface of the doped source layer 242 and the surface of the doped drain layer 241. After forming the metal silicide layer 204, the remaining metal layer may be removed using a wet solution to expose the protective layer 205 and the second sidewall spacers 231 that is not covered by the protective layer 205.

Returning to FIG. 8, after forming the metal silicide layer, a dielectric layer may be formed (S015). FIG. 6 illustrates a corresponding semiconductor structure.

As shown in FIG. 6, a dielectric layer 250 may be formed on the semiconductor substrate 200. The dielectric layer 250 may cover the second gate structure 220, the first gate structure 210, the metal silicide layer 204, the protective layer 205, the first sidewall spacer 232 and the second sidewall spacer 231.

The dielectric layer 250 may be made of any appropriate material, such as silicon oxide, silicon nitride, silicon oxynitride, silicon oxycarbide, silicon carbonitride, or silicon oxycarbonitride etc. In one embodiment, the dielectric layer 250 is made silicon oxide.

Further, referring to FIG. 6, a source plug opening 252, a drain plug opening 251, and a floating plug opening 253 may be formed in the dielectric layer 250. The source plug opening 252 may be formed over a portion of the doped source layer 242; and the drain plug opening 251 may be formed over a portion of the doped drain layer 241.

The source plug opening 252 may provide a space for subsequently forming a source plug. The drain plug opening 251 may provide a space for subsequently forming a drain plug. The floating plug opening 253 may provide a space for subsequently forming a floating plug.

In one embodiment, the source plug opening 252 may expose the metal silicide layer 204 on the surface of the doped source layer 242; and the drain plug opening 251 may expose the metal silicide layer 204 on the surface of the doped drain layer 241. The floating plug opening 253 may be located on the sidewall spacer layer 2312 and the semiconductor substrate 200 between the second gate structure 220 and the first sidewall spacer 232 adjacent to the doped drain layer 241.

In one embodiment, the floating plug opening 253 may expose a portion of the sidewall spacer layer 2312 in the first opening 203. In particular, the floating plug opening 253 may expose the first sidewall spacer 232 and the second sidewall spacer 231 in the first opening 203.

The method for forming the source plug opening 252, the drain plug opening 251 and the floating plug opening 253 may include forming a first mask layer (not shown) on the surface of the dielectric layer 250. The first mask layer may expose portions of the surface of the dielectric layer 250. Then, the dielectric layer 250 may be etched using the first mask layer as a mask until the surface of the metal silicide layer 204 on the doped source layer 242 and the surface of the metal silicide layer 204 on the doped drain layer 241 are exposed. Thus, the source plug opening 252, the drain plug opening 251, and the floating plug opening 253 may be formed in the dielectric layer 250.

In one embodiment, the floating plug opening 253 may expose a portion of the second gate structure 220.

The first sidewall spacer 232 and the second sidewall spacer 231 in the first opening 203 and the second gate structure 220 may be formed on the semiconductor substrate 200 between the first gate structure 210 and the first sidewall spacer 232 adjacent to the doped drain layer 241. The floating plug opening 253 may expose one or more of first sidewall spacer 232 and the second sidewall spacer 231 formed in the first opening 203, and the second gate structure 220.

The materials of the first sidewall spacers 232, the second sidewall spacers 231, and the second gate structure 220 may be different from the material of the dielectric layer 250. When an over-etching occurs, the first sidewall spacer 232 and the second sidewall spacer 231 in the first opening 203 and the second gate structure 220 may have a protection function; and may reduce the probability for the floating plug opening 253 to be connected to the semiconductor substrate 200. At the same time, the floating plug opening 253 may only need to be located on the first sidewall spacer 232 between the second gate structure 220 and the doped drain layer 241, the second sidewall spacer 231 or the semiconductor substrate 200 covered by the second gate structure 220. Thus, the probability of over-etching may be reduced. Accordingly, the process for forming the floating plug may be controlled in a substantially wide range, the distance between the floating plug and the first gate structure may be increased, the probability of shorting the floating plug and the first gate structure may be reduced, and the performance of the semiconductor device may be increased.

In one embodiment, the dielectric layer may include a first dielectric layer and a second dielectric layer on a surface of the first dielectric layer. The first dielectric layer may cover the sidewall surfaces of the first gate structure and the second gate structure.

The method for forming the first dielectric layer may include forming an initial first dielectric layer on the second gate structure, the first gate structure, the doped source layer, and the doped drain layer; and planarizing the initial first dielectric layer until the top surface of the second gate structure is exposed to form the first dielectric layer.

In one embodiment, the first gate structure may be a dummy gate structure, after forming the first dielectric layer, the dummy gate structure may be removed to form a gate opening in the dielectric layer. Then, a gate structure may be formed in the gate opening. The gate structure may be the gate structure of the semiconductor device. After forming the gate structure, a second dielectric layer may be formed on the surface of the first dielectric layer. The second dielectric layer may cover the gate structure and the second gate structure. In another embodiment, the first gate structure may be used as the gate structure of the semiconductor device.

The first gate structure may include a first gate dielectric layer and a gate electrode layer on a surface of the first gate dielectric layer. The first gate dielectric layer of the first gate structure may be made of a high-k dielectric material (the dielectric coefficient greater than approximately 3.9). The high-k dielectric material may include hafnium oxide, zirconium oxide, hafnium silicon oxide, lanthanum oxide, silicon zirconium oxide, titanium oxide, tantalum oxide, barium titanium strontium oxide, titanium barium oxide, titanium strontium oxide, or aluminum oxide, etc. The gate electrode layer may be made of a metal material, and the metal material includes one or a combination of copper, tungsten, nickel, chromium, titanium, tantalum and aluminum, etc. The first gate structure may further include an interface layer between the first gate dielectric layer and the semiconductor substrate. The interface layer may be made of silicon oxide, etc.

Returning to FIG. 8, after forming the source plug opening, the drain plug opening and the floating plug opening, a source plug, a drain plug and a floating plug may be formed (S106). FIG. 7 illustrates a corresponding semiconductor structure.

As shown in FIG. 7, a source plug 262, a drain plug 261, and a floating plug 263 may be formed in the dielectric layer 250. The source plug 262 may be electrically connected to the doped source layer 242. The drain plug 261 may be electrically connected to the doped drain layer 241. The floating plug 263 may be formed on the sidewall spacer layer 2312 and the second gate structure 220.

In one embodiment, the source plug 262 may be in contact with the metal silicide layer 204 on the surface of the doped source layer 242; and the drain plug 261 may be in contact with the metal silicide layer 204 on the surface of the doped drain layer 241.

The method for forming the source plug 262, the drain plug 261, and the floating plug 263 may include forming a plug material layer in the source plug opening 252, the drain plug opening 251, and the floating plug opening 253 and on the dielectric layer 250. Then, the plug material layer may be planarized until the surface of the dielectric layer 250 is exposed, and the source plug 262, the drain plug 261, and the floating plug 263 may be formed.

The process for forming the plug material layer may be a deposition process, such as a chemical vapor deposition (CVD) process, etc. The plug material layer may be made of a metal material, such as tungsten, etc.

The floating plug 263 may be disposed above the second gate structure 220 or the sidewall spacers, the probability of the floating plug 263 being connected to the semiconductor substrate 200 may be reduced. At the same time, the floating plug 263 may only need to be disposed on the second gate structure 220 and the semiconductor substrate 200 covered by the sidewall spacers. Thus, the probability of over-etching may be reduced. Accordingly, the process for forming the floating plug 263 may be controlled in a substantially wide range. The distance between the floating plug 263 and the first gate structure 210 may be increased to reduce the probability that the floating plug 263 is shorted to the first gate structure 210. Accordingly, the performance of the semiconductor device is improved.

The present disclosure also provides a semiconductor device. FIG. 7 illustrates an exemplary semiconductor device consistent with various disclosed embodiments.

As shown in FIG. 7, the semiconductor device may include a semiconductor substrate 200; a first well region 201 and a second well region 202 formed in the semiconductor substrate 200, and the second well region 202 may be located in the first well region 201 The first well region 201 and the second well region 202 have opposite conductivity types. The semiconductor device may also include a first gate structure 210 and a second gate structure 220 formed on the semiconductor substrate 200. The first gate structure 210 may cover a portion of the surface of the second well region 202 and a portion of the surface of the first well region 201. The second gate structure 220 may be disposed on the surface of the first well region 201, and a first opening may be formed between the second gate structure 220 and the first gate structure 210. Further, the semiconductor structure may include a sidewall spacer layer 2312 formed in the first opening; a dielectric layer 250 formed on the semiconductor substrate 200. The dielectric layer 250 may cover the second gate structure 220 and the first gate structure 210 and the sidewall spacer layer 2312. Further, the semiconductor structure may include a floating plug 263 formed in the dielectric layer 250; and the floating plug 263 may be formed on the sidewall spacer layer 2312.

In one embodiment, the floating plug may be formed in the dielectric layer and on the sidewall spacer layer and the second gate structure.

The sidewall spacer layer includes: a first sidewall spacer between the first gate structure and the second gate structure and a second sidewall spacer between the first gate structure and the second gate structure.

The details of the semiconductor substrate 200 may be referred to the previous embodiments. The structures and locations of the first gate structure 210 and the second gate structure 220 may be referred to the previous embodiments. The detailed structures and intermediate structures are described above with respect to the fabrication processes.

The technical solutions of the present disclosure may have at least the following beneficial effects.

In the disclosed method for forming a semiconductor structure, the second gate structure may be configured to limit the position the first opening, and a sidewall spacer layer may be formed in the first opening for protection. Further, the floating plug may be disposed above the second gate structure or the sidewall spacer layer to reduce the probability that the floating plug is connected to the semiconductor substrate. At the same time, the floating plug may only need to be formed on the semiconductor substrate covered by the second gate structure and the sidewall spacer layer to reduce the probability of over-etching. Thus, the process for forming the floating plug may be controlled in a substantially wide range; and the distance between the floating plug and the first gate structure may be increased; and the probability of the floating plug being shorted to the first gate structure may be reduced. Accordingly, the performance of semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor device, comprising:
   providing a semiconductor substrate;
   forming a first well region and a second well region in the semiconductor substrate, wherein the second well region is formed in the first well region and a conductivity type of the first well region is opposite to a conductivity type of the second well region;
   forming a first gate structure on the second well region and a portion of the first well region and a second gate structure on a portion of the first well region, wherein a first opening is formed between the first gate structure and the second gate structure;
   forming a sidewall spacer layer covering sidewall and bottom surfaces of the first opening, the sidewall spacer layer including a first sidewall spacer on each of two sidewall surfaces of the second gate structure and a second sidewall spacer on each of two sidewall surfaces of first gate structure, wherein the sidewall spacer layer includes a first sidewall spacer in the first opening and a second sidewall spacer in the first opening;

forming a doped source layer and a doped drain layer in the semiconductor substrate at a side of the first sidewall spacer away from the first gate structure and a side of the second sidewall spacer away from the second gate structure, wherein the doped source layer is formed in the second well region; the doped drain layer is formed in the first well region; and a conductivity type of the doped source layer and the doped drain layer is the same as the conductivity type of the first well region;

forming a dielectric layer on the semiconductor substrate to cover the first gate structure, the second gate structure and the sidewall spacer layer;

forming a floating plug in the dielectric layer and on the sidewall spacer layer; and before forming the dielectric layer and after forming the doped source layer and the doped drain layer, further comprising:

forming a protective layer on a portion of the surface of the first gate structure adjacent to the second gate structure, the sidewall spacer layer, the second gate structure and a portion of the surface of the semiconductor substrate between the first gate structure and the doped drain layer; and forming a metal silicide layer on the semiconductor substrate, the doped source layer and the doped drain layer exposed by the protective layer.

2. The method according to claim 1, wherein:
a distance between the first gate structure and the second gate structure is approximately equal to or smaller than a sum of a thickness of the first sidewall spacer and a thickness of the second sidewall spacer.

3. The method according to claim 2, wherein:
the distance between the first gate structure and the second gate structure is in a range of approximately 150 nm-300 nm.

4. The method according to claim 3, wherein:
the thickness of the first sidewall spacer is substantially equal to the thickness of the second sidewall spacer; and
the thickness of the first sidewall spacer is smaller than or equal to approximately 1500 Å.

5. The method according to claim 1, wherein:
the second sidewall spacer is formed when forming the first sidewall spacer.

6. The method according to claim 5, wherein forming the first sidewall spacer, the second sidewall spacer and the sidewall spacer layer comprises:
forming a sidewall spacer material layer over the semiconductor substrate to cover the first gate structure and the second gate structure; and
etching back the sidewall spacer material layer to form the first sidewall spacer on a sidewall surface of the second gate structure and the second sidewall spacer on a sidewall surface of the first gate structure and the sidewall spacer layer in the first opening.

7. The method according to claim 1, wherein:
the floating plug formed on the sidewall spacer layer is further formed on the second gate structure.

8. The method according to claim 1, further comprising:
forming a source plug electrically connected to the doped source layer in the dielectric layer; and
forming a drain plug electrically connected to the doped drain layer in the dielectric layer.

9. The method according to claim 1, wherein:
the metal silicide layer is made of one of NiSi, CoSi or TiSi.

10. The method according to claim 1, wherein:
the second gate structure is formed when forming the first gate structure.

11. The method according to claim 1, wherein forming the first gate structure and the second gate structure comprises:
forming an initial gate structure film on the semiconductor substrate to cover the first well region and the second well region;
forming a second mask layer on the initial gate structure film to cover portions of the initial gate structure film; and
etching the initial gate structure film using the second mask layer as an etching mask to form the first gate structure covering a portion of the first well region and a portion of the second well region and the second gate structure covering a portion the first well region.

12. The method according to claim 1, wherein forming the first well region and the second well region comprises:
forming a first pattern layer on the semiconductor substrate to expose a portion of the semiconductor substrate;
performing a first ion implantation process using a first type of ions on the semiconductor substrate using the first mask layer as a mask to form the first well region in the semiconductor substrate;
removing the first pattern layer;
after removing the first pattern layer, forming a second pattern layer on the semiconductor substrate to expose a portion of a surface of the first well region; and
performing a second ion implantation process on the portion of the surface of the first well region exposed by the second pattern layer using a second type of ions to form the second well region in the first well region.

13. A method for fabricating a semiconductor device, comprising:
providing a semiconductor substrate;
forming a first well region and a second well region in the semiconductor substrate, wherein the second well region is formed in the first well region and a conductivity type of the first well region is opposite to a conductivity type of the second well region;
forming a first gate structure on the second well region and a portion of the first well region and a second gate structure on a portion of the first well region, wherein a first opening is formed between the first gate structure and the second gate structure;
forming a sidewall spacer layer covering sidewall and bottom surfaces of the first opening, the sidewall spacer layer including a first sidewall spacer on each of two sidewall surfaces of the second gate structure and a second sidewall spacer on each of two sidewall surfaces of first gate structure, wherein the sidewall spacer layer includes a first sidewall spacer in the first opening and a second sidewall spacer in the first opening;
forming a doped source layer and a doped drain layer in the semiconductor substrate at a side of the first sidewall spacer away from the first gate structure and a side of the second sidewall spacer away from the second gate structure, wherein the doped source layer is formed in the second well region; the doped drain layer is formed in the first well region; and a conductivity type of the doped source layer and the doped drain layer is the same as the conductivity type of the first well region;

forming a dielectric layer on the semiconductor substrate to cover the first gate structure, the second gate structure and the sidewall spacer layer;

forming a floating plug in the dielectric layer and on the sidewall spacer layer;

forming a source plug electrically connected to the doped source layer in the dielectric layer; and forming a drain plug electrically connected to the doped drain layer in the dielectric layer, wherein forming the source plug, the drain plug and the floating plug comprises:

forming a first mask layer on the dielectric layer to expose portions of a surface of the dielectric layer;

etching the dielectric layer using the first mask layer as an etching mask to form a source plug opening over a portion the doped source layer, a drain plug opening over a portion of the doped drain layer and a floating plug opening exposing portions of the first sidewall spacer and the second sidewall spacer in the first opening;

forming a plug material layer in the source plug opening, the drain plug opening and the floating plug opening and on the dielectric layer; and planarizing the plug material layer until the surface of the dielectric layer is exposed to form the source plug, the drain plug and the floating plug.

14. The method according to claim 13, wherein:

a distance between the first gate structure and the second gate structure is approximately equal to or smaller than a sum of a thickness of the first sidewall spacer and a thickness of the second sidewall spacer.

15. The method according to claim 14, wherein:

the distance between the first gate structure and the second gate structure is in a range of approximately 150 nm-300 nm.

16. The method according to claim 15, wherein:

the thickness of the first sidewall spacer is substantially equal to the thickness of the second sidewall spacer; and the thickness of the first sidewall spacer is smaller than or equal to approximately 1500 Å.

17. The method according to claim 13, wherein:

the second sidewall spacer is formed when forming the first sidewall spacer.

18. The method according to claim 17, wherein forming the first sidewall spacer, the second sidewall spacer and the sidewall spacer layer comprises:

forming a sidewall spacer material layer over the semiconductor substrate to cover the first gate structure and the second gate structure; and etching back the sidewall spacer material layer to form the first sidewall spacer on a sidewall surface of the second gate structure and the second sidewall spacer on a sidewall surface of the first gate structure and the sidewall spacer layer in the first opening.

19. The method according to claim 13, wherein:

the floating plug formed on the sidewall spacer layer is further formed on the second gate structure.

\* \* \* \* \*